(12) United States Patent
Luo et al.

(10) Patent No.: US 8,601,849 B2
(45) Date of Patent: Dec. 10, 2013

(54) DEVICE COVER AND METHOD FOR FABRICATING THE SAME

(75) Inventors: Wei Luo, Shenzhen (CN); Lie-Chao Luo, Shenzhen (CN); Yu-Lun Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 1113 days.

(21) Appl. No.: 12/545,207

(22) Filed: Aug. 21, 2009

(65) Prior Publication Data

US 2010/0159267 A1   Jun. 24, 2010

(30) Foreign Application Priority Data

Dec. 19, 2008   (CN) ............ 2008 1 0306407

(51) Int. Cl.
*B21D 28/00* (2006.01)

(52) U.S. Cl.
USPC .............. 72/340; 72/348; 72/466.9

(58) Field of Classification Search
USPC ............ 72/340, 347, 348, 353.2, 379.2, 386, 72/351, 446, 455, 466.9, 482.91
See application file for complete search history.

(56) References Cited

U.S. PATENT DOCUMENTS

| | | | | |
|---|---|---|---|---|
| 4,121,449 A | * | 10/1978 | Celi | 72/350 |
| 5,068,964 A | * | 12/1991 | Yabuno et al. | 29/892.3 |
| 5,706,696 A | * | 1/1998 | Wagner | 72/351 |
| 6,082,166 A | * | 7/2000 | Marin | 72/348 |
| 7,980,112 B2 | * | 7/2011 | Boersma | 72/482.91 |
| 8,015,852 B2 | * | 9/2011 | Su | 72/348 |
| 8,056,384 B2 | * | 11/2011 | Schwenk | 72/348 |
| 8,321,884 B2 | * | 11/2012 | Suzuki | 720/712 |

* cited by examiner

*Primary Examiner* — Edward Tolan
(74) *Attorney, Agent, or Firm* — Altis Law Group, Inc.

(57) ABSTRACT

A device cover includes a bottom base and at least one sidewall extending from the bottom base. The at least one sidewall is formed by an upsetting process. The device cover is made of metal. Only one fold is formed by flow tracks of metallic grain of the at least one sidewall. A method for fabricating the device cover is also disclosed.

6 Claims, 9 Drawing Sheets

DEVICE COVER AND METHOD FOR FABRICATING THE SAME

BACKGROUND

1. Technical Field

The present disclosure relates to device housings, and more particularly to a device cover for electronic devices and a method for fabricating the device cover.

2. Description of Related Art

Generally, metallic device covers present an appealing appearance and contact surface, and thus are popularly used for electronic devices such as mobile phones.

In a typical method for fabricating such a device cover, a metallic sheet is drawn into a preformed cover having a bottom base and a plurality of sidewalls extending substantially perpendicularly from a periphery of the bottom base. The preformed cover is upset by a forming die to thicken the sidewalls. The forming die includes a punch having a working surface extending perpendicular to an axis of the sidewalls. The sidewalls are machined by computerized numerical control (CNC) milling machines to complete the fabrication of the preformed device cover.

FIG. 9 shows a metallographic micrograph of an upset part of an aluminum alloy cover prepared by the above described method. It shows relatively disordered flow tracks of grains. Two large folds are formed by the flow tracks in sections A and B, and two distinguishable micro-cracks are formed in the middle of the two folds. As a result, the sidewalls exhibit diminished mechanical properties, such as low strength and stiffness, during machining by CNC milling machines.

What is needed, therefore, is a device cover that overcomes the limitations described. A highly efficient method of fabricating the device cover is also needed.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the several views, and all the views are schematic.

DETAILED DESCRIPTION OF THE EMBODIMENTS

Figure 1:
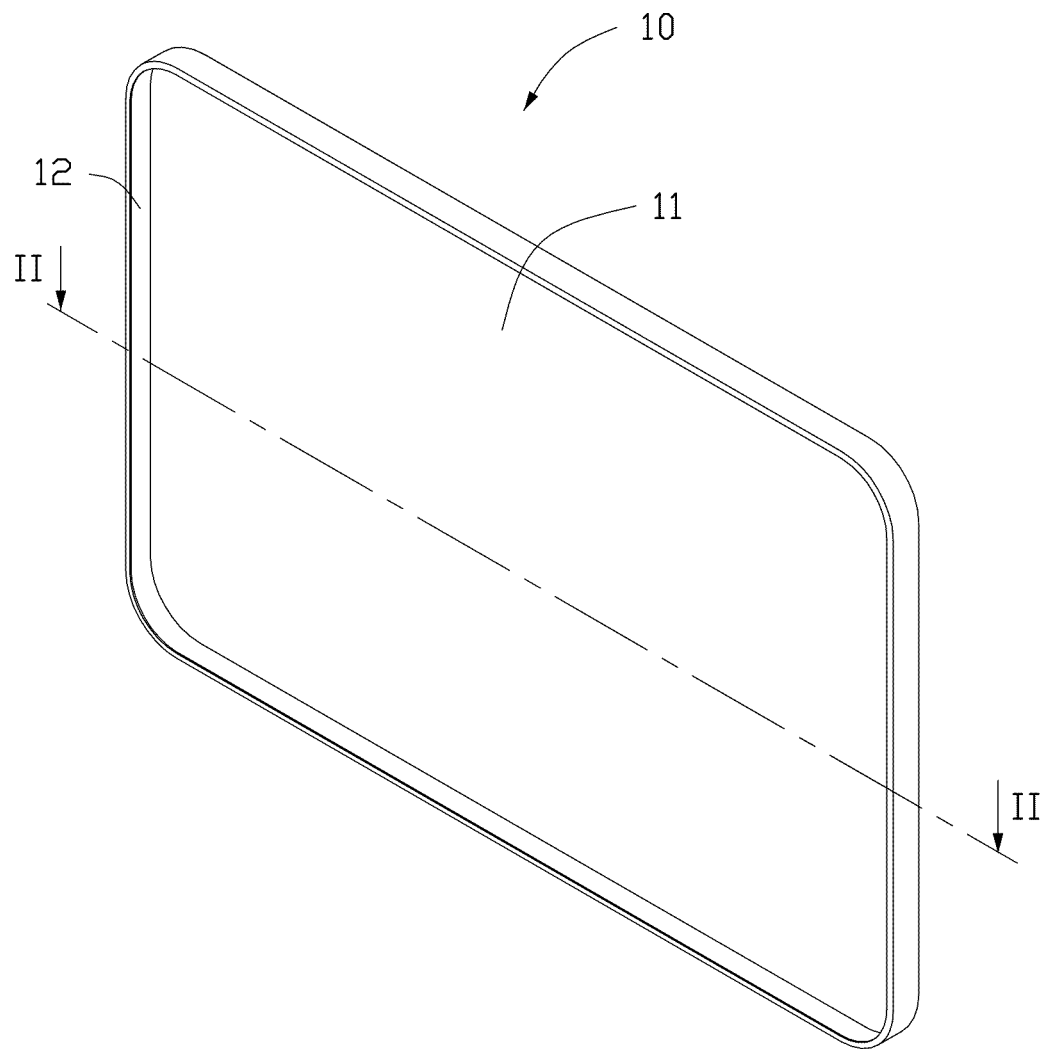
FIG. 1 is an isometric view of one embodiment of a device cover.
Figure 2:
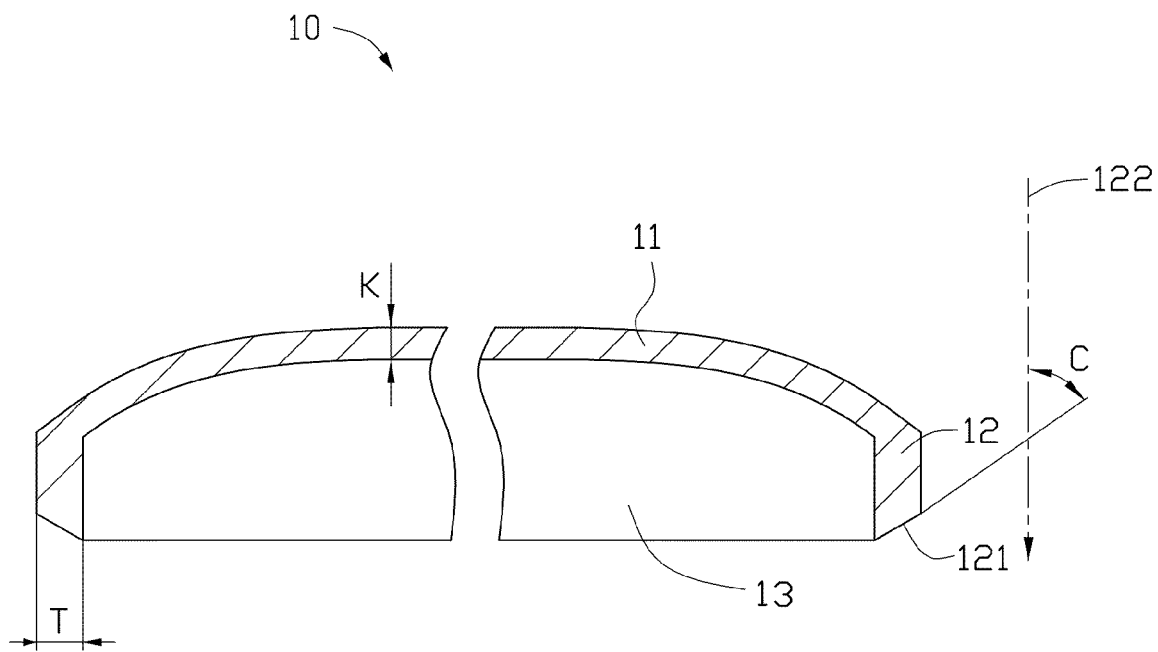
FIG. 2 is a cross-section of the device cover in FIG. 1 taken along line II-II.

Referring to FIGS. 1 and 2, a device cover 10 according to an embodiment is shown. In the illustrated embodiment, the device cover 10 is used for a notebook computer. The device cover 10 includes a rectangular bottom base 11 and four sidewalls 12 extending substantially perpendicularly from a periphery of the rectangular bottom base 11 along an axis 122. The sidewalls 12 are formed by an upsetting process, and the sidewalls 12 and the bottom base 11 cooperatively define a cavity 13. T represents a thickness of the sidewall 12, and K represents a thickness of the bottom base 21. The ratio between T and K (T/K) is preferably about 1 to about 1.76. The sidewall 12 includes an angled contact surface 121, angling from an outer surface to an inner surface of the sidewall 12, toward the bottom base 11. An angle C defined by the contact surface 121 relative to the axis 122 is preferably about 55° to about 65°. In the illustrated embodiment, the angle C is about 60°. It is to be understood that the shape of the bottom base 11 is not limited to being rectangular, and, for example, may be triangular, pentagonal, or any other shape, with a corresponding number of sidewalls, respectively three, five, and so on.

Figure 3:
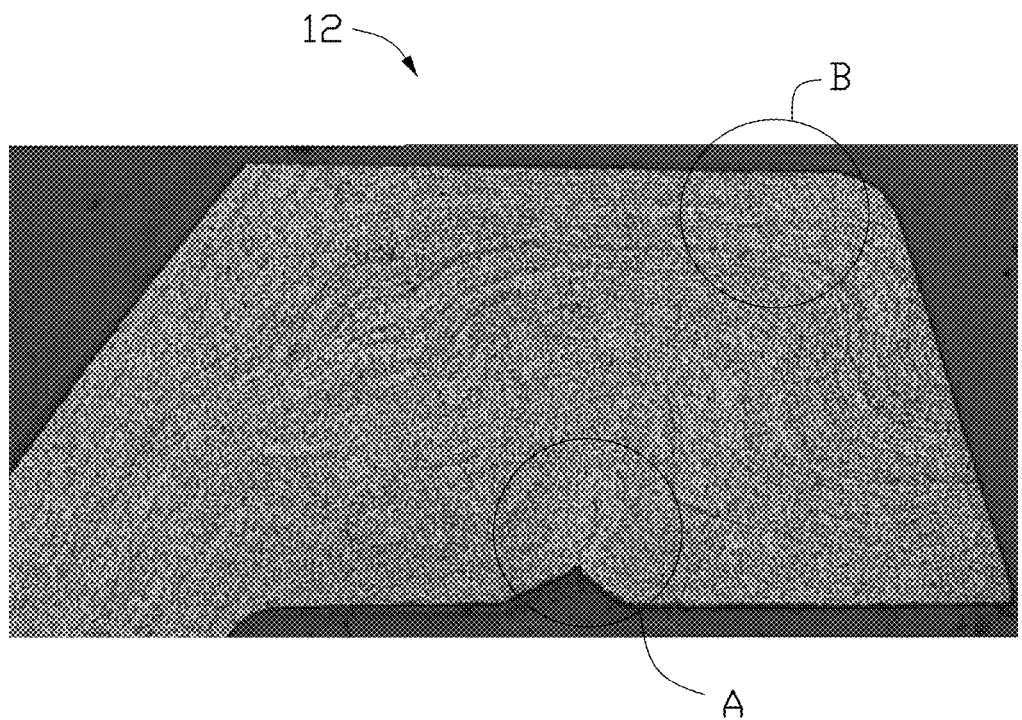
FIG. 3 is a metallographic micrograph of an upset part of the device cover in FIG. 1.

Referring to FIG. 3, a metallographic micrograph of a cross-section of the sidewall 12 under temperatures between about 16° C. to about 26° C. and relative humidity (RH) ranging between about 40% to about 80% is shown for one embodiment of the device cover 10 made of aluminum alloy. The metallographic micrograph magnified at 50× shows only a single fold formed by flow tracks of the metallic grain of the sidewall 12 after upsetting. The metallographic micrograph also shows smooth and well-ordered flow tracks of the metallic grain. The micro-cracks in section A are short, and the micro-cracks in section B are undetectable.

Figure 4:
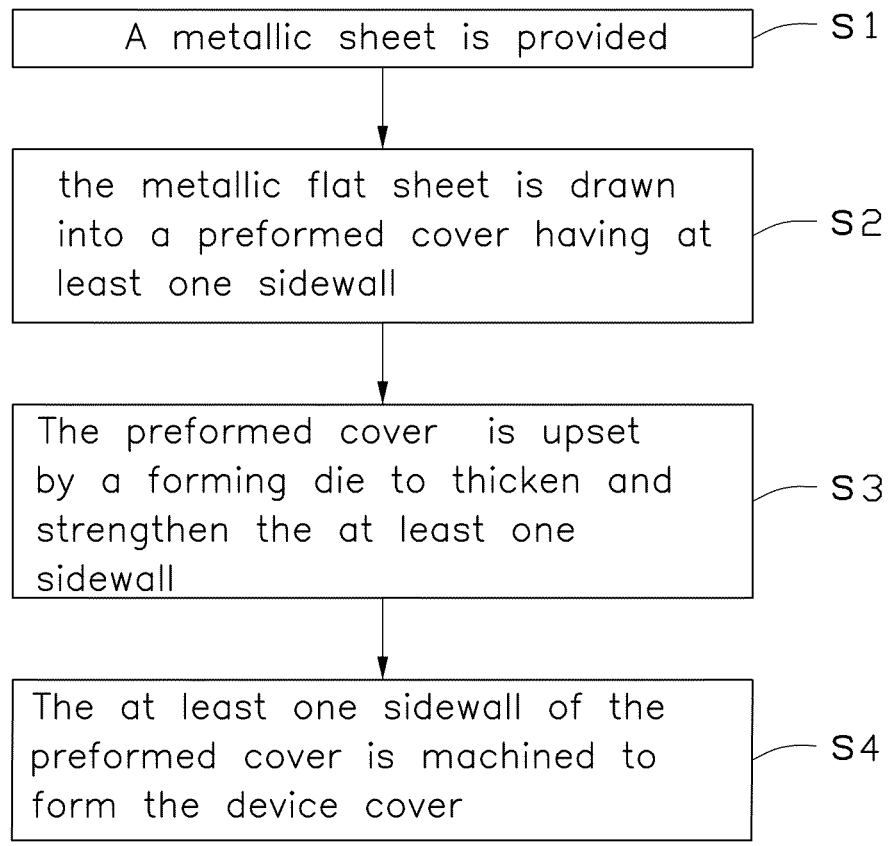
FIG. 4 is a flowchart of one embodiment of a method for fabricating the device cover of FIG. 1.
Figure 5:
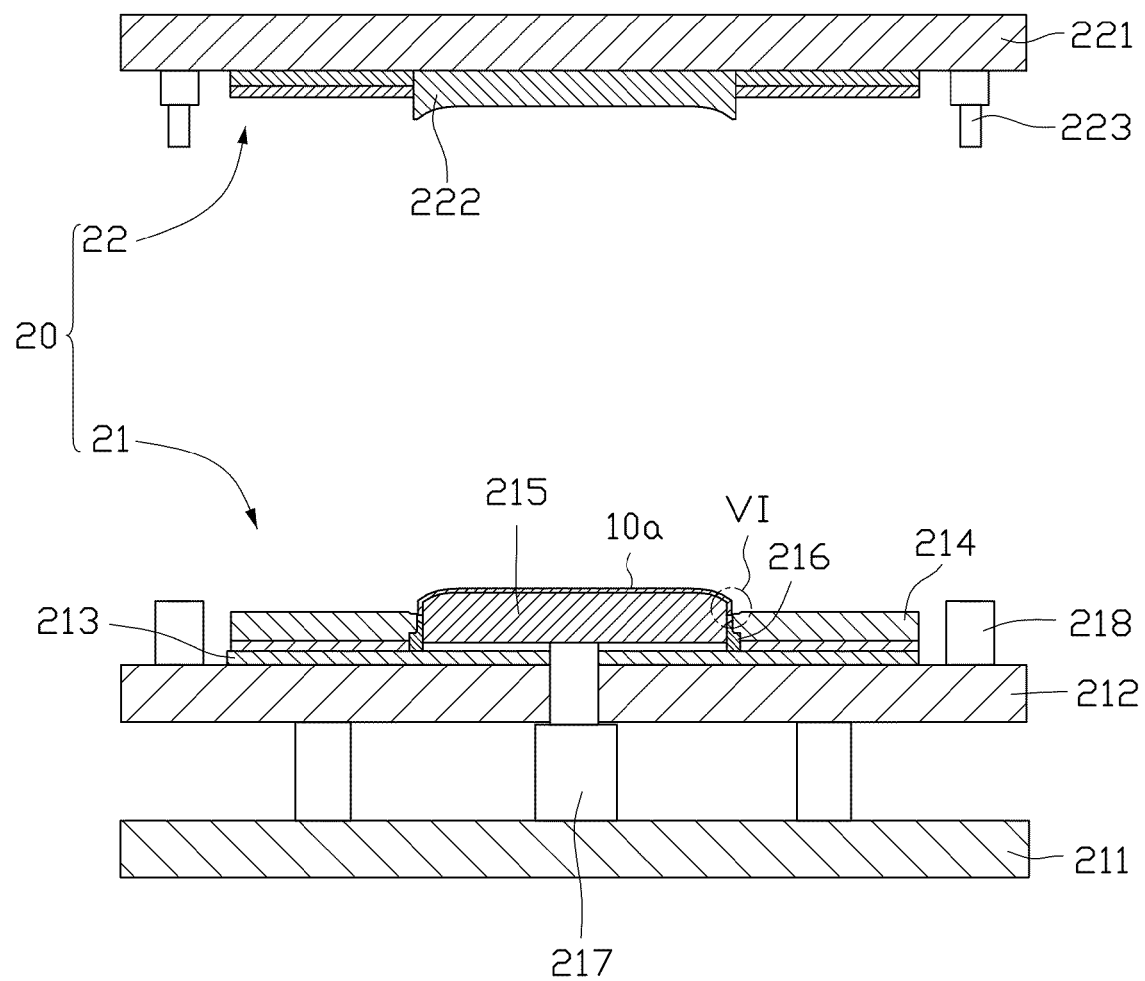
FIG. 5 is a cross-section of a forming die with a preformed device cover used in fabricating the device cover of FIG. 1.
Figure 6:
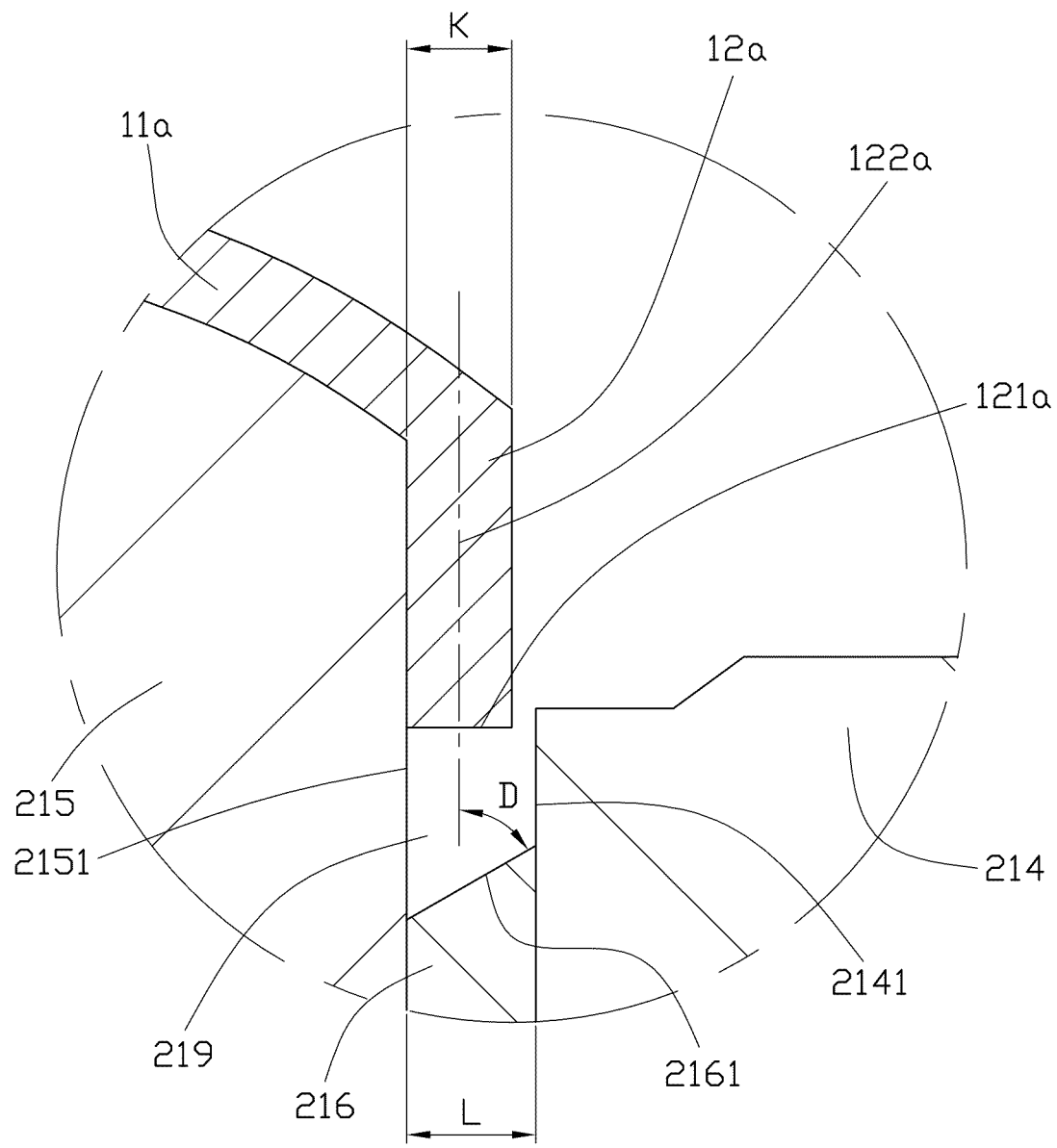
FIG. 6 is an enlarged view of a circular part VI in FIG. 5.

Referring to FIGS. 4 through 6, one embodiment of a method for fabricating the device cover 10 is disclosed as follows. Depending on the embodiment, certain of the steps described below may be removed, others may be added, and the sequence of steps may be altered.

In step S1, a metallic flat sheet (not shown) is provided. In one embodiment, the metallic flat sheet is aluminum alloy.

In step S2, the metallic flat sheet is deeply drawn into a preformed cover 10a. The preformed cover 10a includes a bottom base 11a and four sidewalls 12a extending substantially perpendicularly from a periphery of the bottom base 11a. The sidewall 12a has an axis 122a and a contact surface 121a substantially perpendicular to the axis 122a. The bottom base 11a and the sidewall 12a have about the same thickness K.

In step S3, the preformed cover 10a is upset by a forming die 20 to thicken and strengthen the sidewalls 12a, to reserve space for a subsequent process.

The forming die 20 includes a lower die assembly 21 and an upper die assembly 22. The lower die assembly 21 includes a supporting plate 211, a die set 212, a lower padding plate 213, a die holder 214, a die core 215, a plurality of punches 216, a nitrogen spring 217, and a plurality of guiding bushings 218. The supporting plate 211, the die set 212, the lower padding plate 213, and the die holder 214 are combined together in order. The die holder 214 can be substantially rectangular, and defines a holding hole (not labeled) to receive the die core 215. The die core 215 is able to move in the holding hole.

The die core 215 can be substantially rectangular, and includes a top surface (not labeled) similar to the bottom base 11a of the preformed cover 10a. The punch 216 is fixed to the lower padding plate 213 and is disposed between the die holder 214 and the die core 215. The punch 216 is positioned below the die holder 214 and the die core 215. The punch 216 includes an angled working surface 2161. An angle D defined by the working surface 2161 and the axis 122a of the sidewall 12a is preferably about 55° to about 65°. In the illustrated embodiment, the angle D is about 60°.

The die holder 214 includes a left side surface 2141. The die core 215 includes a right side surface 2151 substantially parallel to the left side surface 2141. The left side surface 2141, the right side surface 2151, and the working surface 2161 together define a mold cavity 219 receiving the sidewall 12a. L represents a width of the mold cavity 219. A ratio between L and K (L/K) is preferably about 1 to about 1.76. One end of the nitrogen spring 217 is fixed to the supporting plate 211, the other end passes through the die set 212 and the lower padding plate 213, and then attaches to the die core 215. The plurality of guiding bushings 218 are fixed to the die set 212.

The upper die assembly 22 includes a punch set 221, a punch core 222, and a plurality of guiding posts 223. The punch set 221 can be substantially rectangular. The punch core 222 is fixed to the punch set 221, and corresponds to the die core 215. The plurality of guiding posts 223 is fixed to the punch set 221 to engage with the guiding bushings 218.

Figure 7:
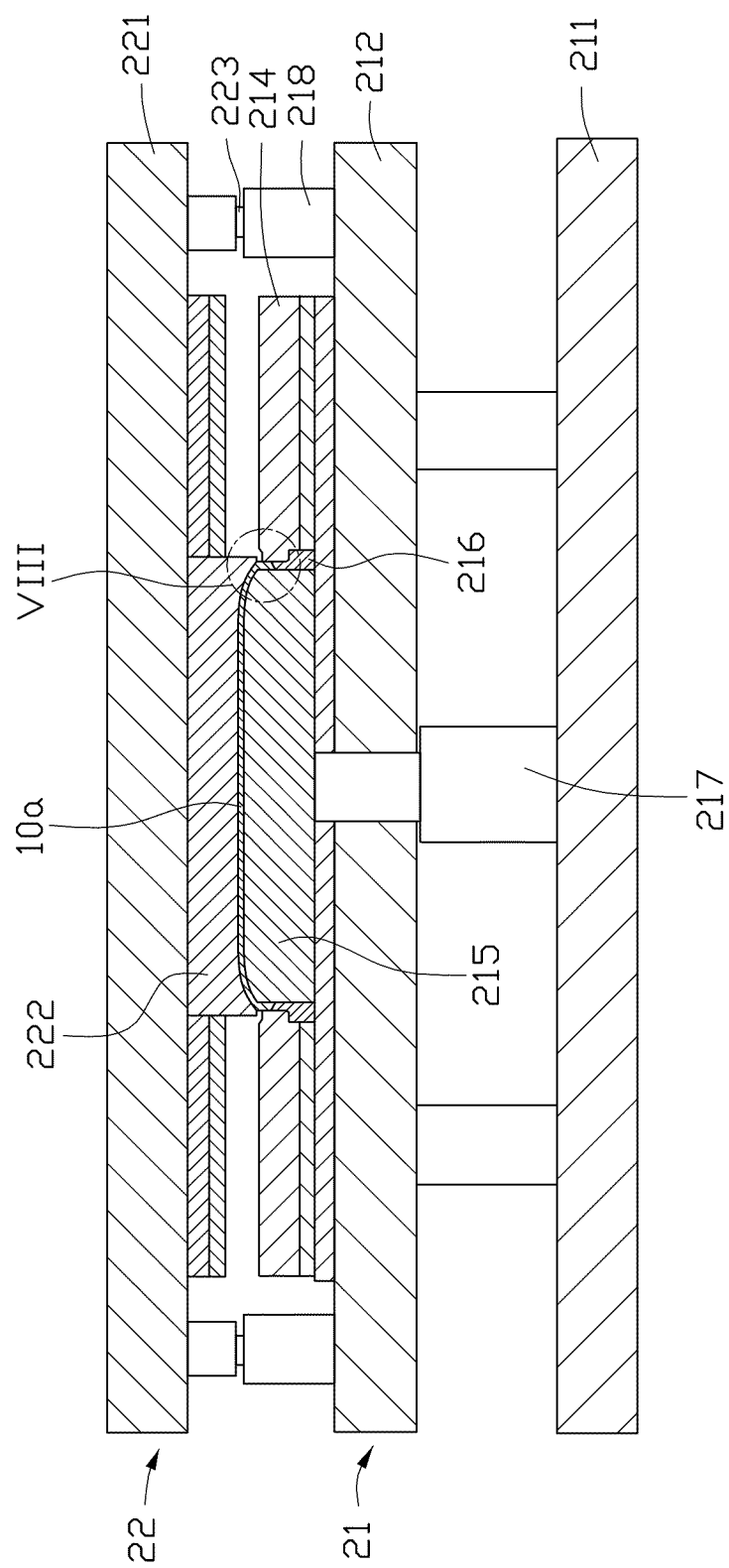
FIG. 7 is similar to FIG. 5, but shows another state of the forming die and the preformed device cover.
Figure 8:
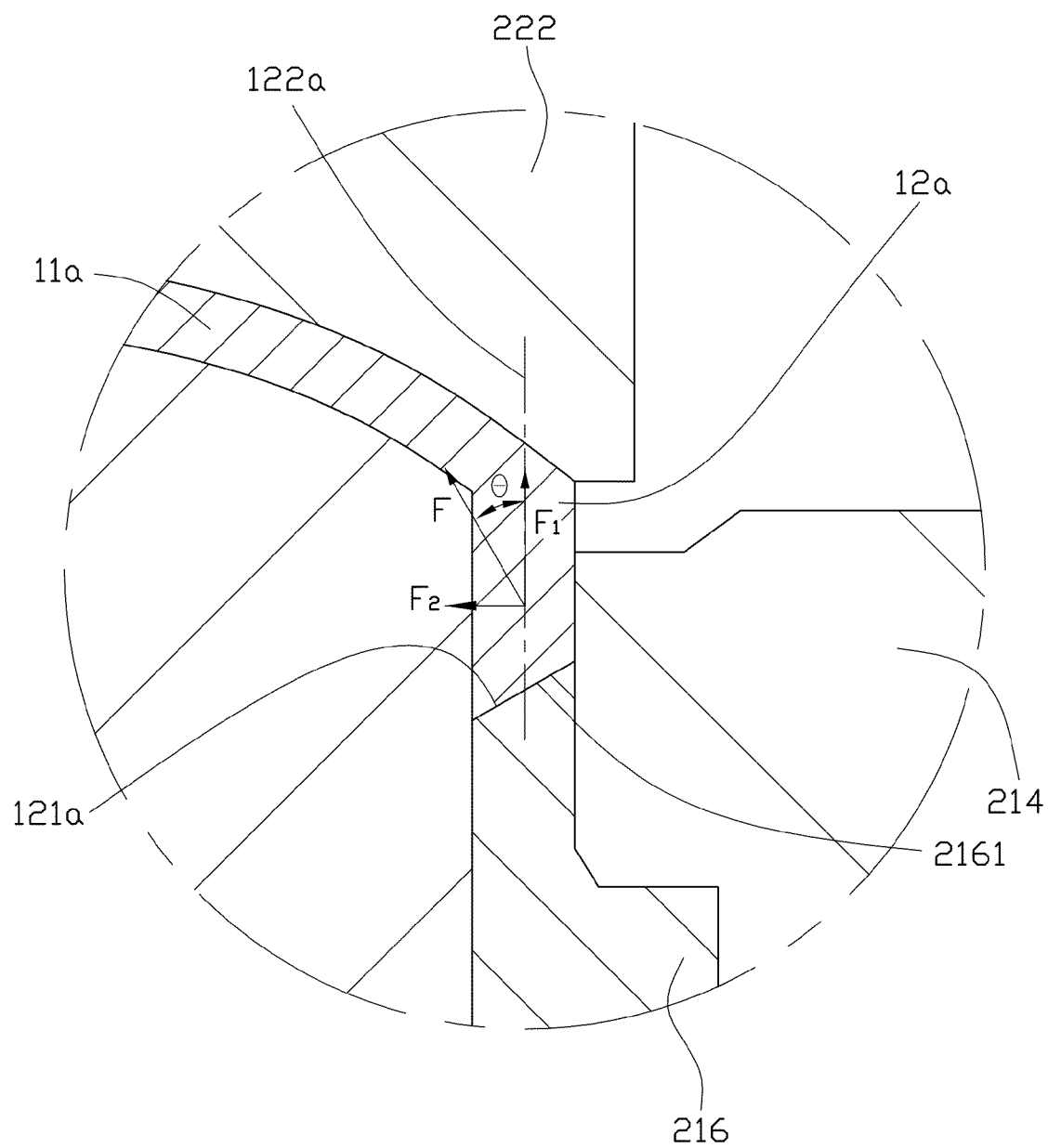
FIG. 8 is an enlarged view of a circular part VIII in FIG. 7.
Figure 9:
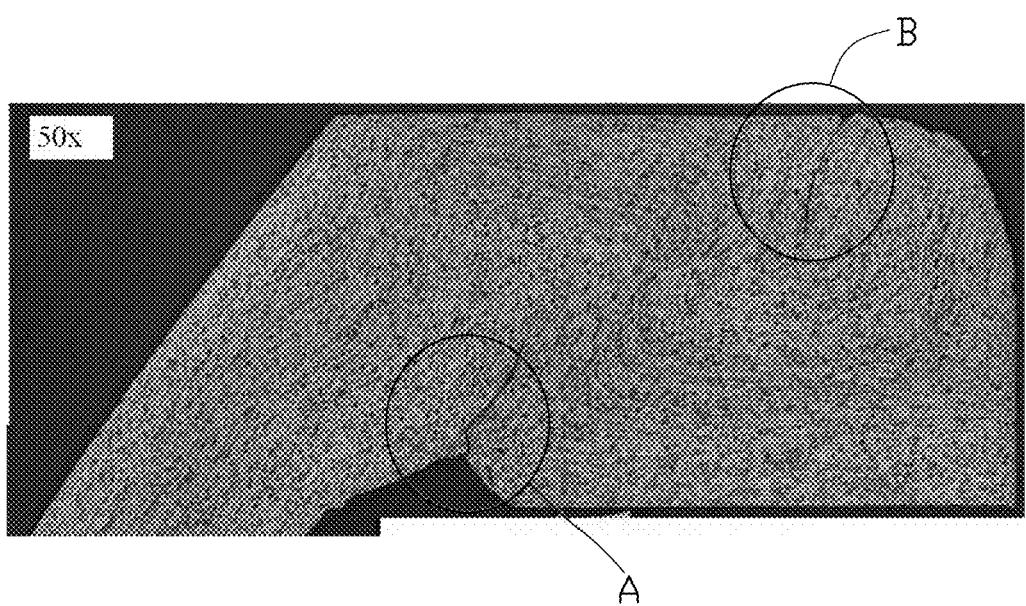
FIG. 9 is a metallographic micrograph of an upset part of a conventional device cover.

Referring to the FIGS. 7 and 8, before upsetting, the preformed cover 10a is placed on the die core 215. During upsetting, the upper die assembly 22 moves downwards towards the lower die assembly 21, and the guiding posts 223 protrude into the corresponding guiding bushings 218. When the punch core 222 contacts the bottom base 11a of the preformed cover 10a, the die core 215 begins to move downwards and compresses the nitrogen spring 217. The sidewalls 12a of the preformed cover 10a are received in the mold cavity 219 and contact the punch 216. The upper die assembly 22 moves further downwards, and the working surface 2161 of the punch 216 moves along the axis 122a of the sidewall 12a relative to the preformed cover 10a. When the contact surfaces 121a of the sidewalls 12a contact the working surface 2161 with a force F, the material of the sidewalls 12a displaces and fills the mold cavity 219, resulting in the sidewalls 12a of the preformed cover 10a exceeding the bottom base 11a in thickness/width.

An angle θ is defined by a direction of force F and the axis 122a because the working surface 2161 of the punch 216 is not parallel to the axis 122a of the sidewall 12a. The angle θ is preferably about 25° to about 35° depending on the angle D. In the illustrated embodiment, the angle θ is about 30°. The force F can be divided into a vertical component force F1 along the axis 122a and a horizontal component force F2 perpendicular thereto. The metallic grains are guided into a smooth and well-ordered flow toward the bottom base 11a by the horizontal component force F2, thus only one fold is formed in section A adjacent to an inner portion of the bottom base 11a.

In step S4, each of the sidewalls 12a of the preformed cover 10a is machined to a predetermined shape by a machining tool such as by CNC, forming the device cover 10. The machining process improves certain mechanical properties, such as strength and stiffness, of the sidewalls 12a compared with sidewalls otherwise fabricated.

The contact surface 121 may angle away from the bottom base 11, as long as the working surface 2161 of the punch 216 angles toward the die core 215.

The punch 216 may also be fixed to one component of the upper die assembly 22, such as the punch set 221, in which case, the die core 215 is fixed to the punch set 221, and the punch core 222 is fixed to the die set 212.

The punch set 221, the lower padding plate 213, the nitrogen spring 217, and the die holder 214 may, alternatively, be omitted.

It is believed that the present embodiments and their advantages will be understood from the foregoing description, and it will be apparent that various changes may be made thereto without departing from the spirit and scope of the disclosure or sacrificing all of its material advantages.

What is claimed is:

1. A method for fabricating a device cover, the method comprising:
   providing a metallic sheet;
   drawing the metallic sheet into a preformed cover having a bottom base and at least one sidewall extending from the bottom base, wherein the at least one sidewall comprises a contact surface;
   upsetting the preformed cover by a forming die to thicken the at least one sidewall, wherein the forming die comprises a punch; the punch moves along an axis of the at least one sidewall relative to the preformed cover; the punch comprises a working surface; an angle defined by an axis of the at least one sidewall relative to at least one of the contact surface of the sidewalls and the working surface of the punch is about 55° to about 65°;
   machining the at least one sidewall of the preformed cover to form the device cover;
   wherein the forming die comprises a lower die assembly and an upper die assembly, and the lower die assembly includes a die set, a die holder, and a die core movably connected to the die set, a supporting plate and a nitrogen spring; and
   wherein the die set is fixed to the supporting plate, one end of the nitrogen spring is connected to the supporting plate, and the other end of the nitrogen spring is connected to the die core.

2. The method of claim 1, wherein the punch is fixed to the lower die assembly or the upper die assembly, and the upper die assembly moves downwards towards the lower die assembly, such that the punch contacts the contact surface of the at least one sidewall, whereby an angle defined by an axis of the at least one sidewall relative to the working surface of the punch is about 55° to about 65°.

3. The method of claim 2, wherein the punch and the die holder are fixed to the die set disposed between the die holder and the die core.

4. The method of claim 3, wherein the die holder comprises a first side surface, the die core comprises a second side surface; the first side surface, the second side surface, and the working surface of the punch together define a mold cavity receiving the sidewall; a ratio of a width of the mold cavity to a thickness of the at least one sidewall is about 1 to about 1.76.

5. The method of claim 4, wherein the upper die assembly comprises a punch core corresponding to the die core, and the punch core and the die core move together, such that the at least one sidewall of the preformed device cover is received in the mold cavity and contacts the punch.

6. The method of claim 3, wherein the die core comprises a top surface having the same shape as the bottom base of the preformed cover.

* * * * *